(12) United States Patent
Ovhsinsky

(10) Patent No.: US 6,999,953 B2
(45) Date of Patent: Feb. 14, 2006

(54) ANALOG NEURONS AND NEUROSYNAPTIC NETWORKS

(75) Inventor: Stanford R. Ovhsinsky, Bloomfield Hills, MI (US)

(73) Assignee: Energy Conversion Devices, Inc., Rochester Hills, MI (US)

( * ) Notice: Subject to any disclaimer, the term of this patent is extended or adjusted under 35 U.S.C. 154(b) by 0 days.

(21) Appl. No.: 10/189,749

(22) Filed: Jul. 3, 2002

(65) Prior Publication Data

US 2004/0006545 A1 Jan. 8, 2004

(51) Int. Cl.
*G06G 7/00* (2006.01)
*G06N 3/06* (2006.01)
*G06N 3/063* (2006.01)
*G06N 3/067* (2006.01)

(52) U.S. Cl. .............................. 706/39; 706/26; 706/27
(58) Field of Classification Search .................. 706/39, 706/26, 27; 257/7
See application file for complete search history.

(56) References Cited

U.S. PATENT DOCUMENTS

| | | |
|---|---|---|
| 5,159,661 A | 10/1992 | Ovshinsky et al. |
| 5,912,839 A | 6/1999 | Ovshinsky et al. |
| 6,141,241 A | 10/2000 | Ovshinsky et al. |

OTHER PUBLICATIONS

L. T. Clark et al, Ferroelectric Thin-film Connections in Integrated Circuit Neural Networks, 1991, IEEE 0-7803-0190-0/91, 730 732.*

Yasuhisa Omura, A Simple and Advanced Neural Circuit Element by Using and SOI Insulated-Cate pn, 1998, IEEE, Proceedin 1998 IEEE Internation SOI Conference, 105-106.*

Chung-Yu Wu, A New Compact Neuron-Bipolar Junction Transistor(vBJT) Cellular Neural Network (CNN) Structure with Programmable Large Neighborhood Symmetric Templates for Image Processing, 2001, IEEE, 1057-7122/01, 12-27.*

Leon O. Chua, Memristor—The Missing Circuit Element, 1971, IEEE, Transactions on circuit Theory, vol. CT-18, No. 5, 507-51.*

* cited by examiner

*Primary Examiner*—Joseph P. Hirl
(74) *Attorney, Agent, or Firm*—Kevin L. Bray; Marvin S. Siskind

(57) ABSTRACT

An analog neural computing medium, neuron and neural networks are disclosed. The neural computing medium includes a phase change material that has the ability to cumulatively respond to multiple input signals. Input signals induce transformations among a plurality of accumulation states of the disclosed neural computing medium. The accumulation states are characterized by a high electrical resistance. Upon cumulative receipt of energy from one or more input signals that equals or exceeds a threshold value, the neural computing medium fires by transforming to a low resistance state. The disclosed neural computing medium may also be configured to perform a weighting function whereby it weights incoming signals. The disclosed neurons may also include activation units for further transforming signals transmitted by the accumulation units according to a mathematical operation. The artificial neurons, weighting units, accumulation units and activation units may be connected to form artificial neural networks.

33 Claims, 9 Drawing Sheets

ANALOG NEURONS AND NEUROSYNAPTIC NETWORKS

FIELD OF THE INVENTION

The instant invention relates to use of a phase change material as a medium for neural computing and neural networks including nodes that incorporate a phase change material.

BACKGROUND OF THE INVENTION

The computer has proven to be one of the most remarkable discoveries in human civilization and has been exploited to the greater good of mankind in the last half of the twentieth century. The use of computers in information storage, data processing, automation, computation, and other applications has greatly simplified many existing tasks while at the same time expanding the range of tasks that can be accomplished by humans. Many complex or laborious tasks can be automated, made more efficient, and completed more rapidly through the use of computers.

Today's computers are characterized by two fundamental attributes. First, computers operate with binary logic. The storage and manipulation of data occurs through conversion to binary strings and transformation of binary strings according to a particular computational objective. The requirement for binary processing is a consequence of the two state nature of silicon, the material that functions as the working substance of today's computer. Binary 0 and 1 states can be readily established in silicon and manipulated to perform computations.

Second, today's computers operate in a sequential fashion. Completion of a computational function is inherently a step by step process. Computer programs are simply line by line instructions that outline a sequence of steps to be implemented by a computer. The steps are executed one by one with the result of preceding steps typically being forwarded to later steps to effect a computation.

Despite their tremendous successes, certain computations or functions remain largely unamenable to solution or implementation by modem computers. Examples of such computations or functions include pattern classification, pattern association, associative memory functions, speech, and character recognition. In fact, many of the tasks that are difficult or cumbersome to implement with a conventional computer are tasks that are readily and intuitively performed by humans and other biological organisms. The recognition of a familiar face in a crowd, for example, is a task that even a small child can perform and yet remains a difficult task for a conventional computer.

The realization of the difficulties in implementing certain routine human tasks with a conventional computer has motivated much effort at better understanding human thought processes and developing computing schemes and devices capable of mimicking, emulating or at least approximating biological information storage and processing. These efforts have spawned the field of neural networks and reinforced appreciation of the unique, largely non-sequential nature of human thought.

Primitive versions of neural networks first came into existence more than 50 years ago with pioneering work by Warren McCulloch and Walter Pitts, on the one hand and Donald Hebb on the other hand. Their simple models were extended and refined in the 1950's and 1960's in work that led to neural networks such as the perceptron, ADALINE and MADALINE. The 1970's were a quiet period for neural networks as researchers began to realize that implementation of neural networks was more difficult than expected. Since about 1980, however, activity in neural networks has exploded as more sophisticated networks, better modeling schemes, and more robust computing methods have been developed. Advances such as the back-propagation method, adaptive resonance theory, self-organization, competitive learning models, multilayer structures and the neocognitron have vastly improved neural networks and provided the impetus for significant continuing activities.

One goal of neural network research is to develop systems that function like the human brain. The neuron is the basic learning unit in the brain of a human. A schematic depiction of a neuron is presented in FIG. 1 herein. A neuron functions by receiving a weighted input signal from its dendrites and responding according to the level of the signal. If the input signal is below some threshold characteristic of the neuron, the neuron does not respond to the signal. If the input signal exceeds the threshold, the neuron responds by transmitting an action potential signal along its axons to the axonic endings. In general, a neuron may have a large number of dendritic inputs and a large number of axons.

The brain comprises billions of neurons assembled in a complex interconnected arrangement. The action potentials at the axonic endings of one neuron provide inputs to succeeding neurons. A signal determined by the action potential is transmitted from one neuron to another at the synapse. The synapse is a junction of the axonic ending or pre-synaptic terminal of one neuron with a dendrite or post-synaptic terminal of another neuron as shown in FIG. 2 herein. The action potential induces the release of neurotransmitters from the pre-synaptic terminal across the synaptic cleft to the post-synaptic terminal of the receiving dendrite. The neurotransmitters enter the post-synaptic terminal and react with proteins therein to produce an electrical potential or charge at the membrane of the post-synaptic terminal. The magnitude of this charge is determined by the strength of the incoming signal (e.g. the number or type of neurotransmitters) and a weighting factor characteristic of the synapse, its function and history. The potential after weighting constitutes an input signal to the dendrite. The weighted signal at each dendrite may be excitatory or inhibitory. The neuron senses the net combined weighted inputs from all of its dendrites in a given interval of time and if this combined input exceeds the threshold of the neuron, it fires, transmits an action potential to its axonic endings for introduction to the dendritic inputs of the next layer of neurons and the process repeats.

In the brain, each neuron is synaptically connected to about 1000 other neurons and when a neuron fires, it sends an action potential to some or all of the neurons to which it is connected. Each of these neurons in turn is connected to another ca. 1000 neurons and a cascading weighted-threshold activation scheme over many layers of neurons occurs. As a result, the neurons in the brain are highly interconnected and form a massively parallel network for signal processing. The higher order reasoning skills of humans and other biological organisms, including the ability to learn and adapt, are thought to be due to the high degree of parallelness and interconnectivity of neurons.

Neural network systems include a plurality of interconnected nodes where each node is intended to incorporate several basic aspects of biological neurons. First, neural network nodes generally include the ability to receive multiple input signals. Second, neural network nodes generally include the concept of an activation threshold for firing with the threshold controlling whether the node fires (i.e. transmits a signal to one or more succeeding nodes). If the cumulative signal received by a node meets or exceeds the threshold, the node fires. If not, the node does not fire and no signal is transmitted. The signal produced upon firing may be referred to as an activation signal. Sometimes this activation signal is the output signal of the node and is directly provided to succeeding nodes, but frequently the activation signal is modified according to an activation or transformation function to provide the output signal of the node. The output signal of a node becomes an input signal to succeeding interconnected nodes. Third, neural network nodes generally include weighting of signals. The signals received by a node from preceding nodes are weighted versions of the output signals produced by the preceding nodes. The weighting is most often achieved by multiplying the output signal provided by a preceding node by a weighting factor. The weighted signals from all interconnected preceding nodes are combined and compared to the threshold to determine whether or not the signal is further propagated to later nodes.

In order to best achieve the learning and adaptability capabilities of biological systems, it is desirable for the nodes in a neural network to approximate the function and behavior of biological neurons as closely as possible. An intrinsic property of biological neurons is their ability to accumulate signals from a large number of inputs and instantly initiate firing upon attainment of a threshold condition. Currently, neural networks are implemented with conventional binary processing computers based on silicon as the computing medium. In order to test whether the activation threshold is met, for example, a series of classic addition and comparison operations must be executed and if warranted, an output signal is generated. The use of silicon as a computing medium does not permit a neural network node to intrinsically or innately respond to the plurality of input signals that it receives. Instead, a series of offline calculations is completed that at best only approximates or simulates the response of a biological neuron. Also, inputs from separate sources are typically processed by independent memory or processing units rather than centrally at a single unit as is the case with a biological neuron. The sequential nature of conventional computing limits the fidelity of neural networks by requiring the separate and serial processing of information. A computing medium that better mimics the innate behavior of a biological neuron is needed to improve the functionality of neural networks.

SUMMARY OF THE INVENTION

The instant invention provides a computing medium for use in neural networks and neural networks that comprise the medium. The instant neural computing medium may be incorporated as the working substance of one or more nodes in a neural network. The instant artificial neurons or neural network nodes comprise the instant neural computing medium and may be interconnected in a highly parallel manner to realistically simulate the configuration of nodes and functionality of a biological neural network. The instant neurons may include signal weighting along with threshold firing and/or activation. Consequently, the instant artificial neurons provide a realistic functional analog of biological neurons and represent a basic building block in the construction of complex neural networks capable of solving problems that are difficult or impossible to solve using conventional computers.

The instant neurons may include a weighting unit, an accumulation unit and/or an activation unit connected in series. The accumulation unit is central to the instant neuron and includes a neural computing medium that is capability of firing upon accumulation of a threshold amount of energy from one or more input signals. The weighting unit precedes the accumulation unit and acts to modify incoming signals through variation of its resistance. The weighting unit may include the instant neural computing medium or other variable resistance means. The activation unit receives a signal from the accumulation unit and further processes it according to a mathematical objective to produce a neuronal output signal that may be used alone or directed to other nodes of a network. The activation unit may include the instant neural computing medium or other computational means.

The instant neural computing medium comprises a phase change material that is able to cumulatively respond to multiple input signals. The instant neurons fire only when this cumulative signal exceeds a threshold characteristic of the instant neural computing medium. Suitable phase change materials generally include a chalcogen element and have the ability to be reversible transformed from a reset state having high electrical resistance to a set state having low electrical resistance as well as the ability to adopt greyscale states having electrical resistances intermediate between those of the set and reset states. The reset state is one of a plurality of accumulation states of the instant neural computing medium having approximately the same electrical resistance. Addition of energy to the reset state of the instant neuron via one or more input signals induces a transformation of the instant neural computing medium to another of the plurality of high resistance accumulation states. Upon accumulation of a sufficient amount of energy, the instant neuron fires with firing corresponding to a transformation of the instant neural computing medium from one of the high resistance accumulation states to the low resistance set state. The resulting decrease in electrical resistance leads to a significant increase in the conductivity of the instant neuron thereby facilitating its ability to transmit a signal to other neurons.

The weighting of input signals to the instant neural computing medium included in an accumulation unit of the instant neuron may be accomplished through resistive modification. Conventional resistive or variable resistive means may be employed to influence the intensity of an incoming electrical signal. Weighting of input signals may also be accomplished through greyscale states of the instant neural computing medium having intermediate electrical resistance. The ability of the instant neural computing medium to transmit a signal may be modulated by controlling its electrical resistance. A high weight synaptic connection may be achieved by lowering the resistance and a low weight synaptic connection may be achieved by increasing the resistance. The instant neural computing medium may thus be configured to operate in an accumulation mode when its firing properties are desired or in a weighting mode when its ability to weight or modify an electrical signal is desired. The accumulation function and weighting function may both be achieved in a given compositional embodiment of the instant neural computing medium by appropriately configuring the material.

One embodiment of the instant artificial neuron includes a weighting unit placed in series with an accumulation unit. In another embodiment of the instant artificial neuron, a weighting unit, an accumulation unit and an activation unit are placed in series. In yet another embodiment, an accumulation unit responsive to synchronous and asynchronous input signals of various types (e.g. electrical, optical, electromagnetic, thermal etc.) is provided. The instant neurons and component units thereof may also be interconnected to form neural networks capable of performing a variety of functions depending on the details of the interconnection scheme. Two layer and multilayer networks may be constructed. Reconfigurability of the instant neurons, component units thereof and neural networks is further provided whereby the functionality of individual units may be dynamically varied to provide new configurations with new functionality. The overall functionality provided by the instant artificial neurons and networks comprising same provide a composite function that realistically and adaptively mimics biological neural networks.

DETAILED DESCRIPTION

The instant invention provides an artificial neuron that realistically mimics the function of a biological neuron. The instant neuron may be used alone or as one of a combination of interconnected nodes in a neural network. The instant neuron includes several intrinsic features of a biological neuron. First, the instant neuron has the ability to receive and respond to a plurality of inputs simultaneously. Second, the instant neuron has the ability to accumulate signals from the plurality of inputs and fires only when the combined energy of the inputs exceeds a threshold value. Third, input to the instant neuron may be weighted. Fourth, output from the instant neuron may be transformed according to an activation function. Fifth, a plurality of the instant neurons may be connected to form a network.

The working substance of the instant neuron is a novel neural computing medium based on a phase change material. The basic properties and chemical compositions of the phase change material of the instant neural computing media and instant artificial neurons have been previously described in commonly assigned U.S. Pat. Nos. 3,271,591, 3,530,441, 5,166,758; 5,296,716; 5,534,711; 5,536,947; 5,596,522; 5,825,046; 5,687,112; 5,912,839; and 6,141,241; the disclosures of which are hereby incorporated by reference. A brief review of some of these properties and compositions as they pertain to the instant neural computing media, instant neurons, and instant neural networks is presented hereinbelow.

The instant neural computing medium is comprised of a phase change material having at least a plurality of high resistance accumulation states, a detectably distinct low resistance state and a greyscale state having intermediate resistance. Preferably, the instant neural computing medium includes a plurality of greyscale states. As used herein, high and low resistance states refer to physical states characterized by high and low electrical resistances, respectively, where the electrical resistances of the high and low electrical resistance states are relative to and detectably distinct from each other. The greyscale states have electrical resistance values intermediate between the high and low resistance states.

Figure 1:
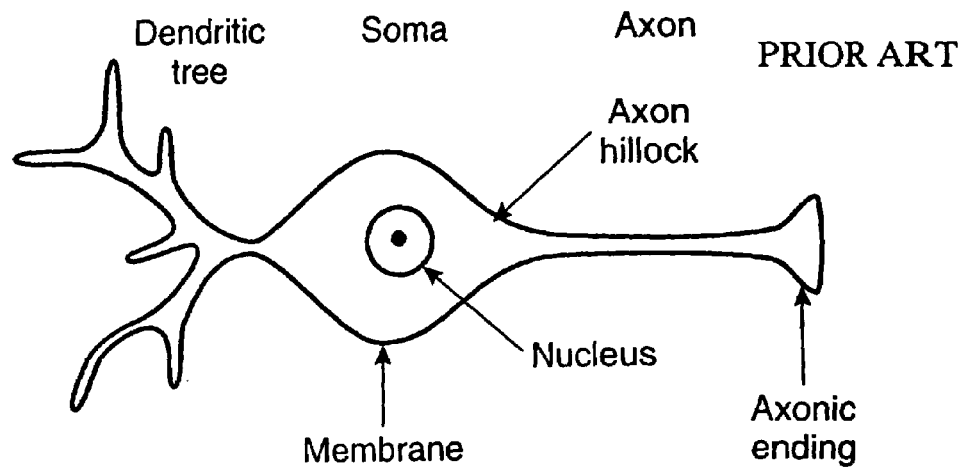
FIG. 1 Schematic overview of a biological neuron.
Figure 2:
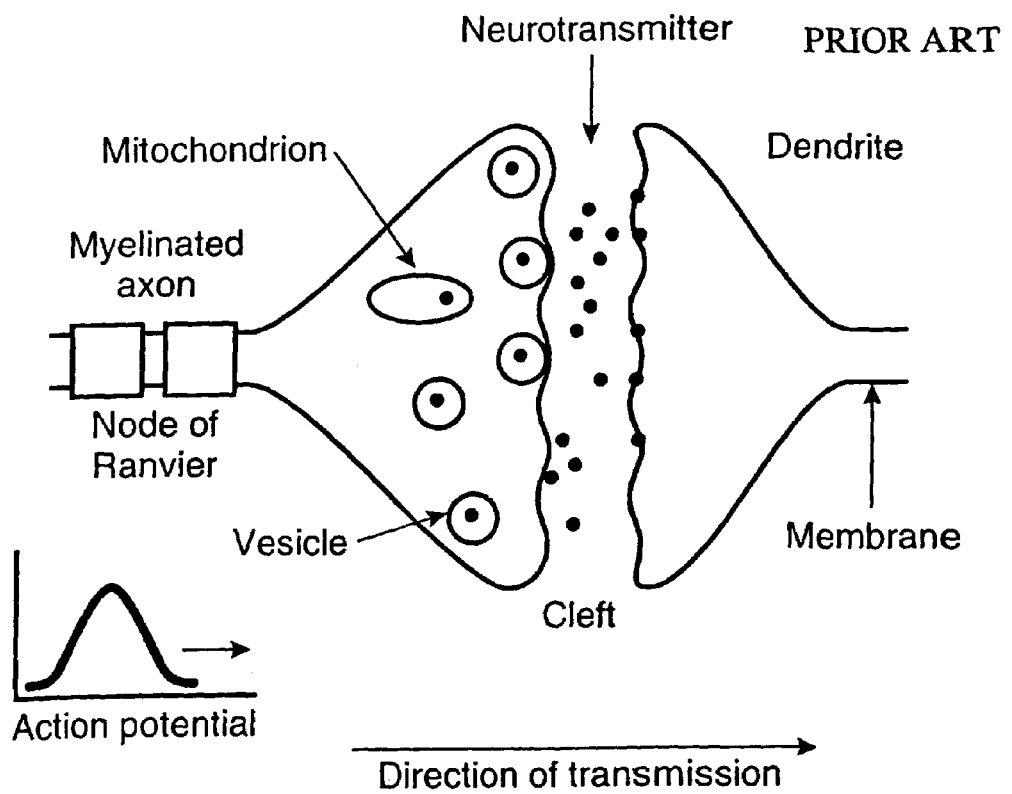
FIG. 2 Schematic overview of biological synaptic connection.
Figure 3:
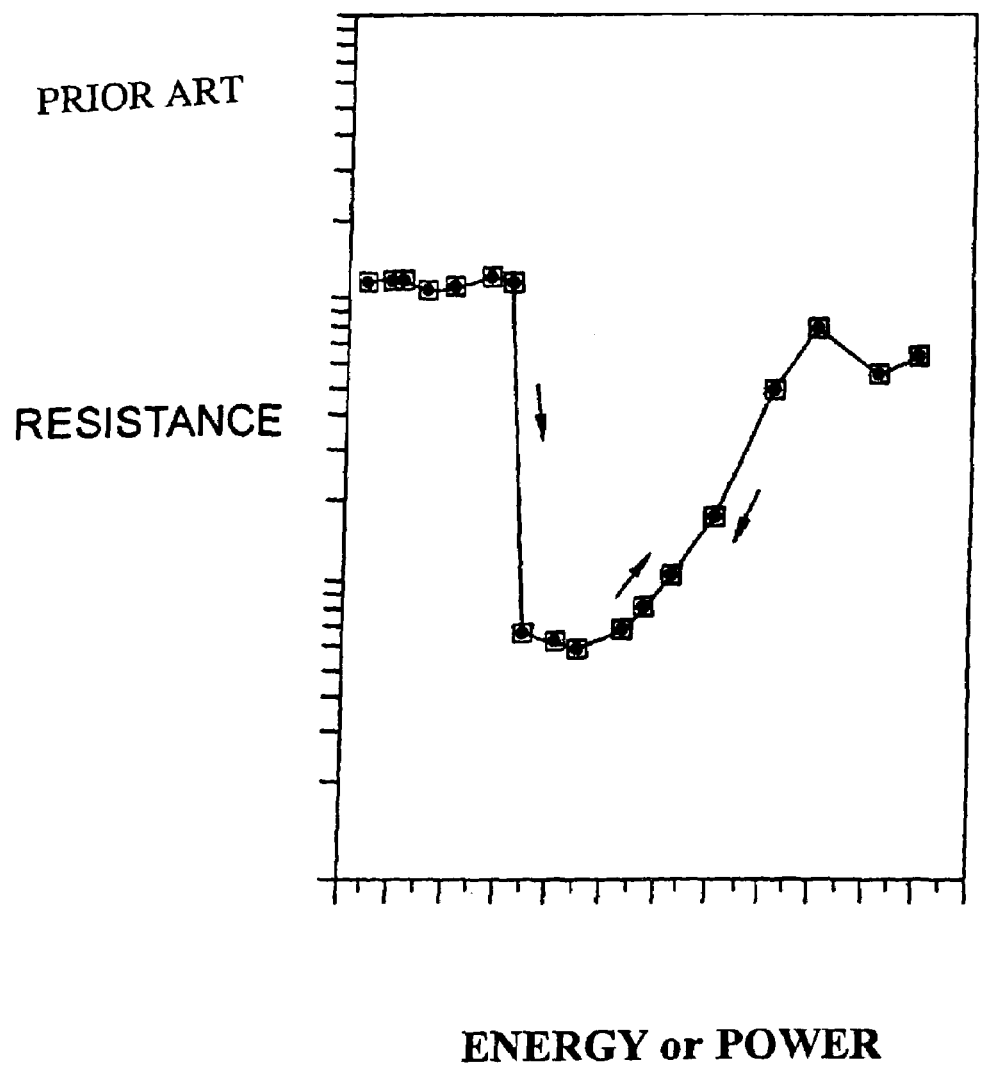
FIG. 3 phase change curve, show both sides of the setting transformation

FIG. 3 disclosed herein is a plot of the electrical resistance as a function of energy or power of a representative phase change material. The behavior depicted in FIG. 3 herein qualitatively corresponds to the preferred response of the instant neural computing medium to energy or power. The symbols shown in FIG. 3 herein represent examples of states that the instant neural computing medium may adopt. The application of energy to a phase change material permits interconversion among the different states as described hereinbelow. The electrical resistance plot can be broadly classified into an accumulation region and a greyscale region where the two regions are separated by a nearly discontinuous change in electrical resistance. The accumulation region corresponds to the high resistance plateau shown on the left side of FIG. 3 herein and the greyscale region corresponds to the remaining portion of the electrical resistance response shown on the right side of FIG. 3 herein. The greyscale region may also hereinafter be referred to as the weighting region for reasons described hereinbelow.

The accumulation region includes a plurality of high resistance states, each of which has substantially the same electrical resistance. States in the accumulation region are hereinafter referred to as accumulation states. If the phase change material is initially in its high resistance state, the application of small amounts of energy leaves the material in its high resistance state. This behavior is depicted by the high resistance plateau region shown on the left side of FIG. 3. If a sufficient amount of energy is applied, however, the phase change material transforms from its high resistance state to its low resistance state. This transformation is depicted by the steep reduction in electrical resistance immediately to the right of the high resistance plateau region of FIG. 3. This transformation of the phase change material from its high resistance state to its low resistance state is hereafter referred to as "setting" or "to set" the phase change material. The low resistance state produced upon setting is hereafter referred to as the "set state" of the phase change material. An amount of energy sufficient to set the phase change material is hereafter referred to as the "set energy" or "setting energy". Note that the set energy is different for each position or state along the high resistance plateau. The reset state may be viewed as the accumulation state having the highest setting energy.

The right side of FIG. 3 corresponds to the behavior of the phase change material when it has been set. Once set, the phase change material is in its low resistance state and is influenced by the application of power according to the post-setting region shown in right side of FIG. 3. This portion of the electrical resistance response curve has been referred to as the analog or greyscale multibit portion of the curve in several of the U.S. Patents incorporated by reference hereinabove. The application of energy to the greyscale region of the phase change material may produce changes in its electrical resistance. The change in electrical resistance is determined by the amount of energy applied and the rate at which the energy is applied. The rate at which energy is provided is hereinafter referred to as power and is an important factor in the behavior of a phase change material in the post-setting, greyscale region.

While not wishing to be bound by theory, the instant inventors believe that establishment of the low resistance set state during the setting transformation is a consequence of the formation of a contiguous crystalline pathway through the phase change material. In the pre-setting, accumulation region, a phase change material is believed to include an amorphous phase component and possibly a crystalline phase component. The presence and relative abundance of the crystalline phase depends on the preparation and processing conditions used in the formation of a phase change material. Processing, for example, that includes melting followed by a rapid quench may be expected to inhibit crystallization, while melting followed by a slow quench may be expected to promote crystallization. If present in the pre-setting, accumulation region, the crystalline phase is dispersed in the amorphous phase and fails to provide a contiguous pathway through the phase change material. Since the amorphous phase has a higher electrical resistance than the crystalline phase, absence of a contiguous crystalline network leads to a high electrical resistance for a phase change material in the pre-setting, accumulation region.

The application of energy in the high resistance plateau, accumulation region of the electrical resistance curve is believed by the instant inventors to increase the relative abundance of a crystalline phase within the phase change material. Provided that a contiguous crystalline network does not form, increased abundance of a crystalline phase does not substantially influence the electrical resistance of a phase change material. Formation of a contiguous crystalline network is believed by the instant inventors to occur during the setting transformation and the decrease in electrical resistance that accompanies the setting transformation is believed to result from the availability of conductive pathways through the contiguous crystalline phase. Since the crystalline phase has a lower resistance than the amorphous phase, the presence of a contiguous crystalline network leads to a lower electrical resistance for a neural computing medium based on a phase change material after setting.

In the post-setting, greyscale region, energy is applied to the low resistance set state and may influence the crystalline network. The addition of energy may lead to heating and an increase in the temperature of a phase change material. If sufficient energy is applied to a phase change material it may be possible to melt or to produce a high mobility state or otherwise thermally disrupt the contiguous crystalline network present upon setting. If melting or inducement of a suitable high mobility state occurs, subsequent cooling very likely leads to a phase change material having a different abundance or connectivity of a crystalline phase component. Melting, inducement of a high mobility state or thermal disruption of the crystalline network may destroy conduction pathways through the lower resistance crystalline phase and thereby lead to an increase in the electrical resistance of a phase change material in the post-setting, greyscale region. Melting, inducement of a high mobility state or thermal disruption of a crystalline network requires that sufficient energy remain at or near the site of heating to permit melting, inducement of a high mobility state or thermal disruption. Since thermal dissipation processes due to thermal conductivity, heat capacity, losses to the surroundings etc. act to remove energy and thus to inhibit melting, inducement of a high mobility state or thermal disruption of a crystalline network, the rate of energy addition must be sufficiently high to permit melting, inducement of a high mobility state or thermal disruption while compensating for thermal dissipation processes. Hence, the rate of energy or power is an important consideration in the post-setting, greyscale region of the electrical resistance curve.

Depending on the power and the state of the phase change material in the greyscale region of FIG. 3, an increase or decrease in electrical resistance may occur. Furthermore, the behavior in the greyscale region is reversible. This reversibility is depicted by the two arrows shown in the greyscale region of FIG. 3 and is believed by the instant inventors to reflect a reversible ability to vary the nature of the crystalline network in the phase change material. A power and electrical resistance may be associated with each point in the greyscale region. If the applied power exceeds the power associated with the point describing a phase change material in the greyscale region, the electrical resistance of the phase change material increases. Conversely, if the applied power is less than the power associated with the point describing a phase change material in the greyscale region, the electrical resistance decreases. It is believed by the instant inventors that increases in electrical resistance in the greyscale region reflect an interruption or reconfiguration of the crystalline component of a phase change material in such a way that conductive pathways through the crystalline component are reduced in number, size or capacity and vice versa for decreases in electrical resistance in the greyscale region.

The reversibility is limited to the greyscale region of FIG. 3. It is not possible to reverse the setting transformation by applying an energy corresponding to a point in the high resistance accumulation region of FIG. 3 that precedes (i.e. is to the left of) the setting transformation. It is possible, however, to restore the high resistance state of the phase change material by applying a sufficiently high power to a material described by a point in the greyscale region of FIG. 3. The application of such power corresponds to moving in the rightward direction in FIG. 3, rather than in the direction of reversing the setting transformation. As shown in the greyscale region of FIG. 3, the application of continually increasing amounts power leads to a continual increase in electrical resistance. Upon application of sufficient power to drive the phase change material to the far right side of FIG. 3, the phase change material returns to its high resistance state and renews its high resistance plateau of accumulation states. It is believed by the instant inventors that restoration of the high resistance plateau occurs when the power provided to the phase change material is sufficient to destroy the contiguousness of any crystalline component of the phase change material. Restoration of the high resistance plateau of accumulation states may occur due to a reduction of the abundance of the crystalline component in the phase change material (for example, through a melting and quenching process that increases the abundance of the amorphous component), a reconfiguration or redistribution of the crystalline component in such a way that contiguousness is lost, or a combination thereof.

The power or rate of energy needed to transform a phase change material from a greyscale state to a high resistance state is hereafter referred to as the "reset power", "resetting power", "reset energy", "resetting energy" or the like. The low resistance set state corresponds to the greyscale state having the maximum reset energy. The state of the phase change material at the conclusion of the application of the reset energy is hereafter referred to as the "reset state". The application of the reset power "resets" the phase change material to produce a high resistance reset state and places the phase change material in its accumulation region. The behavior observed upon further application of energy after resetting is corresponds to that described hereinabove for the accumulation region of FIG. 3. The plot shown in FIG. 3 corresponds to one cycle of setting and resetting. The phase change material may be reproducibly set and reset over a large number of cycles. In a preferred embodiment, the characteristics of the reset state are constant and reproducible over each cycle of setting and resetting.

Illustrative phase change materials suitable for use as neural computing media according to the instant invention are those that include one or more of the elements In, Ag, Te, Se, Ge, Sb, Bi, Pb, Sn, As, S, Si, P, O and mixtures or alloys thereof. In a preferred embodiment, the phase change material includes a chalcogen element. Especially preferred are phase change materials that include a chalcogen in combination with Ge and/or Sb such as $Ge_2Sb_2Te_5$ and related materials. In another preferred embodiment, the phase change material includes a chalcogen and a transition metal such as Cr, Fe, Ni, Nb, Pd, Pt or mixtures and alloys thereof. Some examples of phase change materials suitable for use as neural computing media according to the instant invention are provided in U.S. Pat. Nos. 5,166,758; 5,296,716; 5,524,711; 5,536,947; 5,596,522; 5,825,046; 5,687,112; 5,912,839; 3,271,591 and 3,530,441, the disclosures of which are hereby incorporated by reference. The instant neural computing medium may also include a mixture of a dielectric material and a phase change material. Examples of such mixtures are described in commonly assigned U.S. Pat. No. 6,087,674, the disclosure of which is hereby incorporated by reference. Phase change materials suitable as neural computing media according to the instant invention include a reset state and a plurality of intermediate states distinct in energy from and having substantially the same resistance as the reset state, a set state having a detectably lower resistance than the reset state as well as one or more greyscale states.

An important aspect of biological neurons is their ability to cumulatively receive inputs at their post-synaptic dendritic terminals from multiple sources and to discriminatively respond to the combined input signal according to a threshold energy that is characteristic of the neuron and its function. If the combined input signal has a strength that exceeds the threshold of the neuron, the neuron responds by firing. Neuronal firing is a process whereby a neuron transmits an action potential along its axon to its axonic endings. The action potential is an electrical signal. The axonic endings correspond to pre-synaptic inputs to succeeding neurons in an interconnected assembly of neurons. If the combined dendritic input signal does not exceed the threshold energy, the neuron does not fire and no action potential is transmitted. Thus, depending on a cumulative input signal, a biological neuron knows whether or not to respond to a particular input stimulus. This fundamental firing step is central to the learning and cognition processes of biological organisms. To fire or not to fire is the basic decision step of biological neurons.

The accumulation region of a phase change material provides accumulation states that are utilized in the instant neural computing medium, instant neurons and instant neural networks. The existence of accumulation states imparts on the instant neurons the ability to cumulatively respond to input signals and to respond when accumulated input signals exceed a threshold. As described more fully hereinbelow, input signals are provided to the instant neurons, neural networks or units thereof. Input signals may be directly provided by an external user or may correspond to a stimulus associated with an effect or event in the external surroundings. Input signals may include energy in various forms and may be modified or weighted prior to being applied to the accumulation states of the instant neural computing medium. Further discussion of input signals is provided hereinbelow.

The accumulation region of the instant neural computing medium provides a mechanism whereby the instant neural computing medium may cumulatively respond to input signals without changing its conductivity until a threshold is reached. As described hereinabove, for example, introduction of a sub-setting input signal to a phase change material in its reset state causes the phase change material to progress toward the set state without changing its electrical resistance. Since the electrical resistance of the phase change material remains high, a neuron that includes the instant neural computing medium is inhibited from transmitting electrical signals or otherwise communicating with other neurons to which it may be connected. The phase change material has, however, progressed toward the set state to a degree that is characteristic of the input signal received. Progress from the reset state of a phase change material to an accumulation state as well as transformations among accumulation states are therefore tantamount to cumulatively responding to one or more input signals. Even though the electrical resistance of a phase change material in the accumulation region does not materially change, position along the high resistance plateau is determined by the input signals received by the instant neural computing medium. The accumulation state in which the instant neural computing medium is in, therefore, corresponds to the cumulative input signal received by the instant neural computing medium. A neural computing medium configured to be in an accumulation state may hereinafter be referred to as being in "accumulation mode" or performing an "accumulation function".

Provided that the combined input signal is insufficient to set the instant neural computing medium, the instant neural computing medium remains in an accumulation state. Exposing the instant neural computing medium to an input signal that is insufficient to set induces a transformation of the instant medium from its reset state to an accumulation state or from one accumulation state to another accumulation state. The state into which the instant neural computing medium is transformed is a persistent state and remains until an additional one or more input signals is provided. The irreversibility of the instant neural computing medium in its accumulation region means that the instant neural computing medium always progresses toward the set state in response to input signals. Since progress toward the set state is directly related to the strength of the input signals received, the instant neural computing medium, while in its accumulation mode, may be thought of as storing or retaining a record of the inputs it has received.

When the accumulated input signal is sufficient to induce setting of the phase change material of the instant neural computing medium, the instant neural computing medium transforms to its set state. Since the set state has low electrical resistance, the setting transformation leads to a substantial increase in the conductivity of the instant neural computing medium thereby greatly facilitating its ability to transmit electrical signals or otherwise electrically communicate with succeeding neurons or units thereof. The setting transformation of the instant neural computing medium is thus tantamount to the firing that occurs in a biological neuron. The setting transformation of the instant neural computing medium, or the instant neurons or nodes comprised thereof, may hereinafter be referred to as "firing".

The firing of the instant neural computing medium occurs when a cumulative input signal provides energy in an amount sufficient to set the phase change material included in the instant neural computing medium. The setting energy of the instant neural computing medium is thus analogous to the threshold energy of a biological neuron. In a preferred embodiment, the instant neural computing medium is in its reset state prior to application of an input signal and the set energy of the reset state corresponds to the threshold of the instant neural computing medium. Upon firing, the instant neural computing medium is in its set state. The cumulative response capability of the instant neural computing medium may be renewed by resetting the phase change material as described hereinabove. While in an accumulation state, the instant neural computing medium accumulates all input signals by progressing along the high resistance plateau of a phase change material as described hereinabove. Upon firing, the instant neural computing medium is in a low resistance set state and efficiently transmits signals to succeeding neurons or units thereof. This enhanced transmission ability is retained with respect to arriving input signals until the instant neural computing medium is returned to its accumulation mode by resetting as described hereinabove. When an input signal includes more energy than is required to fire the instant neural computing medium when it is in an accumulation state, a portion of the input signal is accumulated until firing occurs and a portion is transmitted according to the properties of the set state formed upon firing.

The instant neural computing medium may also be used to provide a weighting function analogous to the weighting of neurosynaptic connections that occurs in biological neural networks. A weighting capability may be obtained from the greyscale portion of the electrical response behavior of the phase change material included in the instant neural computing medium. As discussed hereinabove, the greyscale states of a phase change material provide a plurality of states spanning a continuously variable range of electrical resistance. The electrical resistance ranges from a minimum value for greyscale states at or near the set state to a maximum value that approaches the electrical resistance of states in the accumulation region. As described hereinabove, a phase change material may be reversibly transformed in the greyscale region through application of an appropriate power. As indicated hereinabove in connection with FIG. 3, each greyscale state is associated with a power and electrical resistance. Application of a power in excess of the power associated with a particular initial greyscale state of the instant neural computing medium, but less than the power required to reset the phase change material, transforms the instant neural computing medium to a greyscale state having a higher resistance than the initial greyscale state. Conversely, application of a power less than the power associated with the initial greyscale state transforms the instant neural computing medium to a greyscale state having a lower resistance than the initial greyscale state.

While configured to be in a greyscale state, the instant neural computing medium may hereinafter be referred to as being in "weighting mode" or performing a "weighting function". A greyscale state may also hereinafter be referred to as a "weighting state" and the electrical resistance of a weighting state may also hereinafter be referred to as a "weighting factor". A weighting state may be used to weight the input signal provided to a connected portion of the instant neural computing medium operating in accumulation mode by attenuating the signal according to its electrical resistance or weighting factor. A weighting state having a low electrical resistance is more conductive and better able to transmit an electrical signal than a weighting state having a high electrical resistance. Thus, a weighting state having a low electrical resistance may be equivalently be viewed as having a high weighting factor since such a weighting state transmits most or all of an incoming electrical signal to a connected portion of the instant neural computing medium operating in accumulation mode. Conversely, a weighting state having a high electrical resistance may equivalently be viewed as having a low weighting factor since a high electrical resistance substantially diminishes the strength of an incoming electrical signal and leads to transmission of a weakened or attenuated electrical signal to a connected portion of the instant neural computing medium operating in accumulation mode. A portion of the instant neural computing medium operating in weighting mode may thus be seen as providing a mechanism for controlling the extent of electrical communication between a portion of the instant neural computing medium operating in accumulation mode with its surroundings. Since the electrical resistance of the instant neural computing medium is variable over a wide range over its plurality of weighting states, substantial control over the extent of electrical communication is possible by appropriately selecting a weighting state. This quality of the weighting mode of the instant neural computing medium is analogous to the weighting factors associated with synaptic connections in biological neural networks.

Weighting of an input signal may also be generally accomplished through resistive modification of the signal wherein the weighting factor is determined by the resistance encountered by the input signal. As described hereinabove, the instant neural computing medium may be configured to provide weighting by placing the medium into a greyscale state within the weighting region of its electrical resistance response curve to achieve a weighting function. Other resistive means may similarly provide a weighting function. Conventional resistors, variable resistors or other resistive elements may be placed in combination with the instant neural computing medium configured to operate in accumulation mode to achieve a weighting function. General resistive signal weighting may be viewed in one embodiment as a simple manifestation of Ohm's law. For a given potential, for example, the current passing through a resistor, variable resistor, other resistive means or the instant neural computing medium configured to operate in weighting mode depends on the magnitude of the electrical resistance. High resistance leads to weak transmission of a current signal, while low resistance leads to strong transmission of a current signal. The resistance thus provides a weighting factor according to which a signal is modified.

Figure 4:
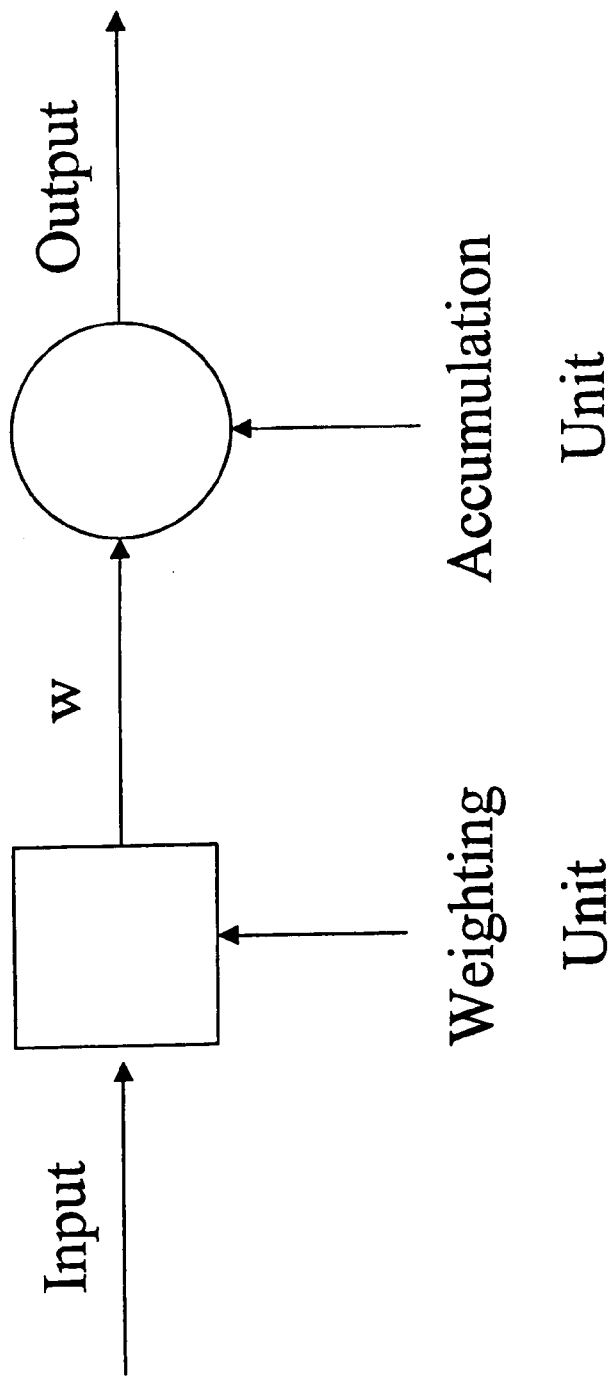
FIG. 4 is a schematic depiction of an artificial neuron according to one embodiment of the instant invention. The square represents a weighting unit and the circle represents an accumulation unit.

In one embodiment of the instant invention, an artificial neuron that includes a weighting unit and an accumulation unit is provided. The weighting unit includes general resistance means or a volume of the instant neural computing medium that is configured to operate in weighting mode as described hereinabove. The accumulation unit includes a volume of the instant neural computing medium that is configured to operate in accumulation mode as described hereinabove. The weighting unit and accumulation unit are connected in series. The weighting and accumulation units may also be in direct physical contact. If, for example, the weighting unit includes a portion of the instant neural computing medium configured to operate in weighting mode and the accumulation unit includes a portion of the instant neural computing medium configured to operate in accumulation mode, the two portions of the instant neural computing medium may be in physical contact with each other. A schematic depiction of the artificial neuron of this embodiment is presented in FIG. 4 herein. In FIG. 4, the weighting unit is represented by a square and the accumulation unit is represented by a circle. These representations shall be used throughout the discussion of the instant invention. In the embodiment of FIG. 4, an input signal is received by the weighting unit and weighted according to the weighting factor of the weighting state in which the instant neural computing medium or general resistance means exists. As described hereinabove, the weighting factor is related to the electrical resistance of the weighting state and the weighting unit modifies the input signal to produce a weighted signal w that is provided to the accumulation unit. The weighting factor thus determines the extent of electrical communication between the weighting unit and the accumulation unit.

The accumulation unit receives the weighted signal and responds to it as described hereinabove. If the weighted signal is insufficient to set the instant neural computing medium of the accumulation unit, the accumulation unit cumulatively responds to the signal by progressing toward the set state to a degree characteristic of the magnitude of the weighted signal. In this situation, the accumulation unit is transformed from one accumulation state to another accumulation state. Since the accumulation states have high electrical resistance, the accumulation unit effectively blocks the signal and eliminates or at least greatly inhibits production or transmission of an output signal. While in an accumulation state, the accumulation unit is capable of receiving additional signals from the weighting unit and cumulatively stores such signals until the accumulated energy is sufficient to set the volume of the instant neural computing medium within the accumulation unit. Upon setting, the resistance of the accumulation unit is greatly reduced and the accumulation unit is able to provide an output signal. As described hereinabove, setting of the accumulation may also be referred to as firing of the accumulation unit or firing of the instant artificial neuron in general.

In order for firing of the accumulation unit to occur, the accumulated energy provided to it since it was last reset must meet or exceed the threshold of the instant neural computing medium contained within the accumulation unit. As used herein, threshold refers to the energy required to transform the instant neural computing medium from its reset state to the set state. As described hereinabove, the accumulation states of the instant neural computing medium are persistent and retained by the accumulation unit until altered through the effect of another signal or other interaction that provides energy to it. Thus, the energy required to set the accumulation unit is reduced by an amount commensurate with the strength of the weighted signals it receives until it is reduced to zero at which point it fires. Firing may be induced by a single weighted signal of sufficient strength or by a plurality of weighted signals none of which alone is capable of inducing firing, but which together provide sufficient energy to set the accumulation unit.

In another embodiment of the instant invention, two or more weighting units are connected in series. Combinations of weighting units, each of which modifies an incoming signal, increases the range of signal modification and net strength of weighted signals provided to accumulation units. Passage of an input signal through a first weighting unit modifies the signal according to a first weighting factor. Subsequent passage of this signal through a second weighting unit further modifies the signal according to a second weighting factor. Multiple weighting units may thus be used to expand the range of signal strengths made available to accumulation units in a network.

Figure 5:
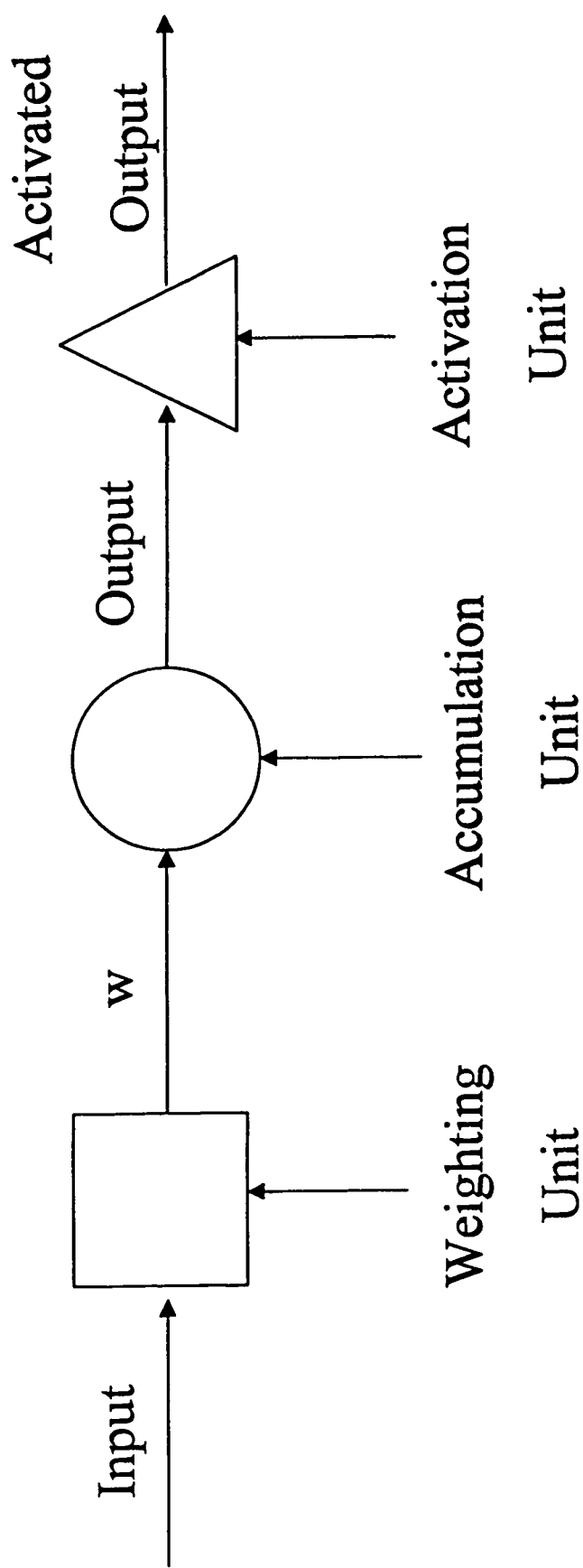
FIG. 5 is a schematic depiction of an artificial neuron according to one embodiment of the instant invention. The square represents a weighting unit, the circle represents an accumulation unit and the triangle represents an activation unit.

In another embodiment of the instant invention, an artificial neuron that includes a weighting unit, an accumulation unit and an activation unit is provided. The purpose and function of the weighting unit and accumulation unit in this embodiment are as described hereinabove. The activation unit is connected in series with and succeeds the accumulation unit. A schematic depiction of one example of this embodiment is presented in FIG. 5 herein. The activation unit is represented by a triangle in FIG. 5 herein and throughout the discussion of the instant invention. The activation unit receives the output signal from the accumulation unit and further modifies it according to an activation function. An activation function is a mathematical function that transforms the output signal according to a mathematical operation. The mathematical operation may be a simple operation such as addition, subtraction, multiplication, or division or a more complicated operation such as factoring, modular arithmetic or more complex functions such as polynomials, exponentials, trigonometric functions, hyperbolic functions, statistical functions, non-linear functions, sigmoid functions etc. The activation unit performs a role analogous to the activation that occurs in biological neurons. After transforming the output signal from the accumulation unit, the activation unit provides an activated output signal having a magnitude determined by the strength of the output signal and the activation function. The activated output signal may then be further provided to other computing devices, artificial neurons, neural network nodes etc.

The activation unit may include a conventional computing device such as a binary silicon computing device or may include a non-binary computing medium such as those described in U.S. patent application Ser. Nos. 10/144,319 and 10/155,527 assigned to the instant assignee, the disclosures of which are hereby incorporated by reference. U.S. patent application Ser. Nos. 10/144,319 and 10/155,527 further describe examples of computational methods that utilize a non-binary computing medium. These methods are examples of activation functions that may be used in accordance with the instant invention. The activation unit may further include additional input signals and circuitry needed to effect transformation of the output signal received from the accumulation unit according to the activation function and production of the activated output signal. These additional input signals are provided directly to the activation unit.

Figure 6:
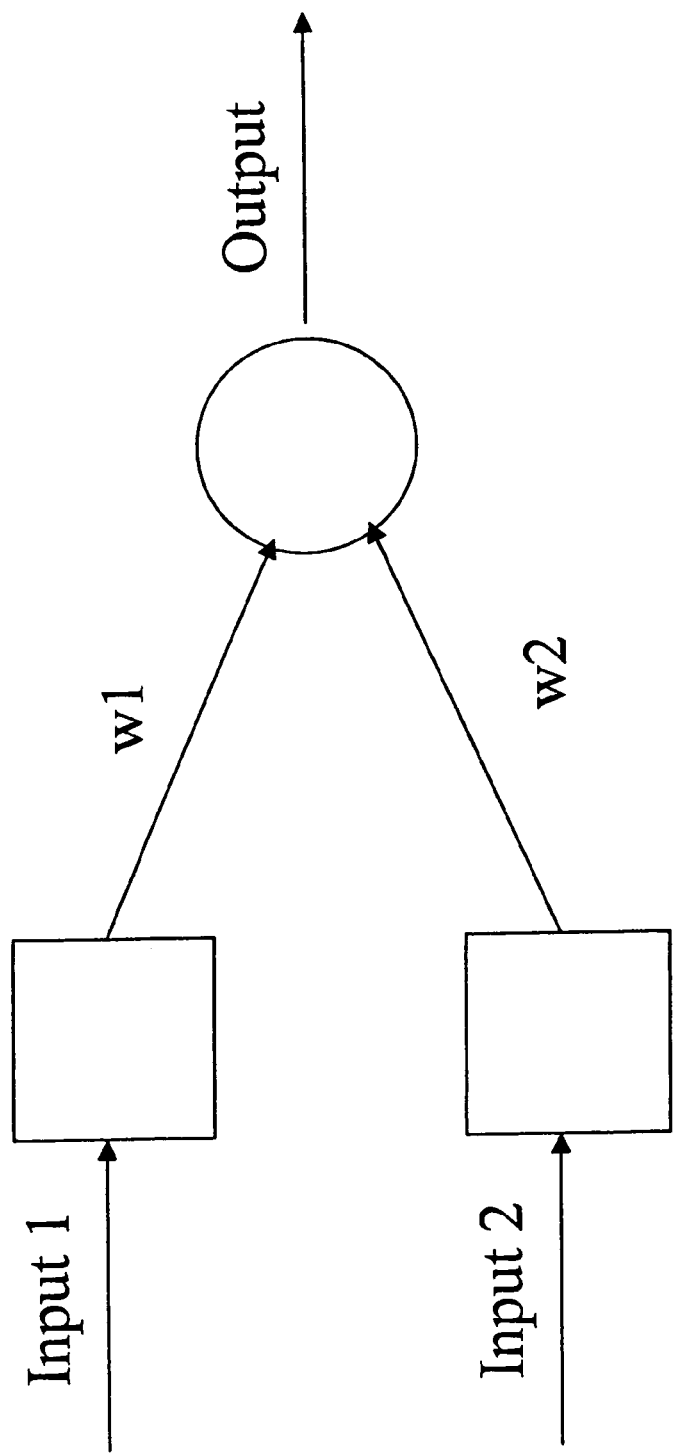
FIG. 6 is a schematic depiction of a combination of two weighting units and one accumulation unit according to the instant invention. The square represents a weighting unit and the circle represents an accumulation unit.

In other embodiments of the instant invention, artificial neurons or accumulation units that receive a plurality of input signals are provided. In these embodiments, an accumulation unit may receive weighted signals from two or more weighting units. An example is presented in FIG. 6 herein. In the embodiment of FIG. 6 herein, inputs are provided to two different weighting units and weighted to provide two weighted signals $w_1$ and $w_2$ that, in turn, are provided to an accumulation unit. The two input signals may be of the same or different type and may have the same or different strength. The two weighting units may weight according to the same or different weighting factors and may include the same or different phase change material composition. The two weighted signals $w_1$ and $w_2$ are received by the accumulation unit. The accumulation unit responds to the signals by transforming among accumulation states or firing according to whether the cumulative effect of the weighted signals is sufficient to set the accumulation unit as described hereinabove. Arrival of the two weighted signals to the accumulation unit may be synchronous (simultaneous) or asynchronous (staggered in time). If synchronous and the combined weighted signal is insufficient to set, the accumulation unit responds by transforming from an initial accumulation state to an intermediate accumulation state where the energy difference between the two accumulation states is characteristic of the combined strength of the two weighted signals received by the accumulation unit. If asynchronous and the combined weighted signal is insufficient to set, the accumulation unit responds by transforming from an initial accumulation state to a first intermediate state upon receiving the first of the two weighted signals and further responds by transforming from the first intermediate state to a second intermediate state upon receiving the second of the two weighted signals. Regardless of whether the two weighted signals are received synchronously or asynchronously, the accumulation state into which the accumulation unit is ultimately transformed is the same. This follows from the intrinsic additive or cumulative nature of the instant neural computing medium when it operates in accumulation mode.

Analogous reasoning applies if the combined weighted signal is sufficient to set. Upon synchronous receipt of two weighted signals, the combination of which is sufficient to set, the accumulation unit responds by setting. Any signal in excess of that needed to set may be provided as an output signal. The response of the accumulation unit to asynchronous receipt of two weighted signals, the combination of which is sufficient to set, depends on whether either or both of the two weighted signals alone is sufficient to set. If neither of the two weighted signals is sufficient to set, the accumulation unit responds to receipt of the first of the two weighted signals by transforming from an initial accumulation state to an intermediate accumulation and further responds to the second of the two weighted signals upon its arrival by setting. If the first of the two weighted signals alone is sufficient to set, the accumulation unit responds by setting and later arrival of the second of the two weighted signals is transmitted as an output signal.

Related embodiments in which more than two inputs are provided to an accumulation unit also are included in the scope of the instant inventions. Embodiments in which three, four or more weighted inputs are provided synchronously or asynchronously to an accumulation unit, for example, are within the scope of the instant invention. The weighting factors of different weighting units may be the same or different. Embodiments that include weighted and unweighted inputs in combination are further included in the scope of the instant invention. Unweighted signals are signals provided directly to an accumulation unit without passing through a weighting unit. Unweighted signals include bias signals. Bias signals are signals that are constant in magnitude and unrelated to other inputs or effects produced in environment in which the instant neuron, unit thereof or neural network exists. Bias signals may be used to adjust the output of a neuron, unit thereof or neural network and is a useful degree of freedom in the training of neural network to provide a desired response to a particular input stimulus. A bias may be used to represent a predisposition or to skew the output of a network toward one or more outcomes known to preferentially occur in a particular learning or experiential context. In all of these embodiments, the accumulation unit cumulatively accepts weighted or unweighted input signals, progressively transforms among its accumulation states toward the set state and ultimately fires if the combined signal from all inputs exceeds a threshold. Until reset, further signals provided to the input unit may be transmitted as output signals through the low resistance set state of the accumulation unit. An activation unit as described hereinabove may also be included in these embodiments, where the activation unit succeeds the accumulation unit.

The instant invention further provides accumulation units responsive to synchronous or asynchronous input signals of various types. The ability of the instant neural computing medium to cumulatively respond to input signals according to energy includes the ability to respond to different forms of energy. Electrical, optical, electromagnetic, and thermal signals may provide the energy used to transform the instant neural computing medium from one accumulation state to another or the energy needed to fire the instant neural computing medium. In one embodiment, an electrical signal in the form of an electric current is provided to the accumulation unit. This electric current may be in the form of an electric current pulse having a controllable pulse duration, pulse shape and magnitude. In another embodiment, electromagnetic energy is provided to the accumulation unit. The electromagnetic energy may, for example, be energy having a frequency in the optical, infrared, radio frequency or microwave region.

The input signals may also be received synchronously or asynchronously from one or more sensory units in communication with a surrounding environment. The surrounding environment may provide external stimuli that may be considered or responded to by the instant artificial neurons, units thereof, or instant neural networks. External stimuli may include heat, light, sound, motion, moisture, electric potential, chemical species (including gases or vapors). The instant neurons, units thereof and instant neural networks may respond directly to such external stimuli or may respond to such stimuli through sensory units. Sensory units responsive to external stimuli may produce a signal commensurate with or characteristic of the external stimulus. Such signals may be applied as input signals to the weighting and/or accumulation units of the instant invention. As an example, a photocell may be used as a sensory unit whereby an electrical signal is produced in response to an external light stimulus. A microphone is an example of a sensory unit that responds to external sound stimuli by providing an electrical signal. Other sensory units include cameras, motion detectors, and chemical sensors. Responsiveness to external stimuli of various types further extends the analogy of the instant invention with biological systems.

Figure 7:
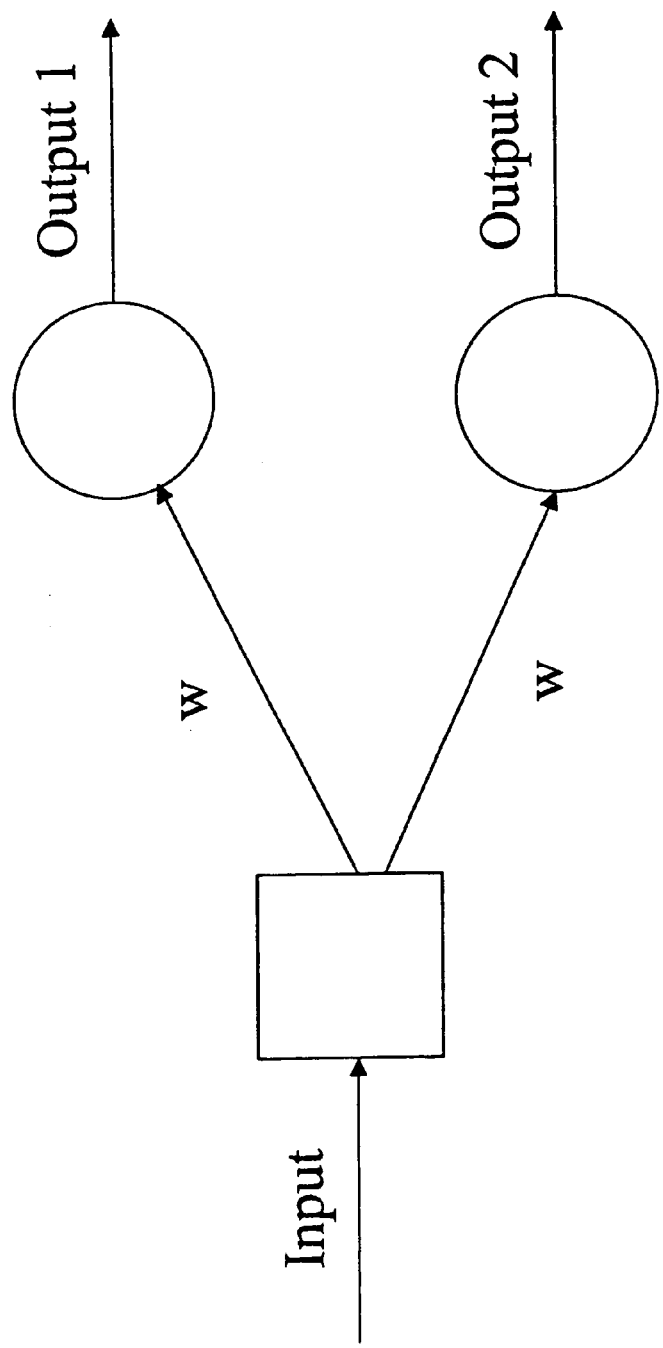
FIG. 7 is a schematic depiction of a combination of one weighting unit and two accumulation units according to the instant invention. The square represents a weighting unit and the circle represents an accumulation unit.

Embodiments in which a weighting unit provides a weighted output signal to two or more accumulation units are also provided in the instant invention. One such embodiment is depicted in FIG. 7 herein, which shows a weighting unit providing a weighted signal to each of two accumulation units. In the embodiment of FIG. 7, an input signal is provided to a weighting unit that weights and divides the signal to provide weighted signals to each of two accumulation units. Related embodiments in which a weighting unit provides a weighted signal to three or more accumulation units are also within the scope of the instant invention. These embodiments may further include activation units succeeding some or all of the accumulation units.

Embodiments including two or more accumulation units may be viewed as neural networks. The term network or neural network as used herein refers to configurations that include one or more weighting units in combination with two or more accumulation units. Activation units may also be included. Since firing occurs at the accumulation units and since different accumulation units may include different phase change material compositions with different thresholds, the term network or neural network shall be used to refer to combinations of units that include two or more accumulation units since such combinations may include two or more thresholds. Networks represent a generalization of the preceding embodiments in which one or more weighting units is in combination with one accumulation unit or one weighting unit is in combination with one or more accumulation units. In a network, one or more weighting units may be in combination with one or more accumulation units. Activation units may be further included.

Figure 8:
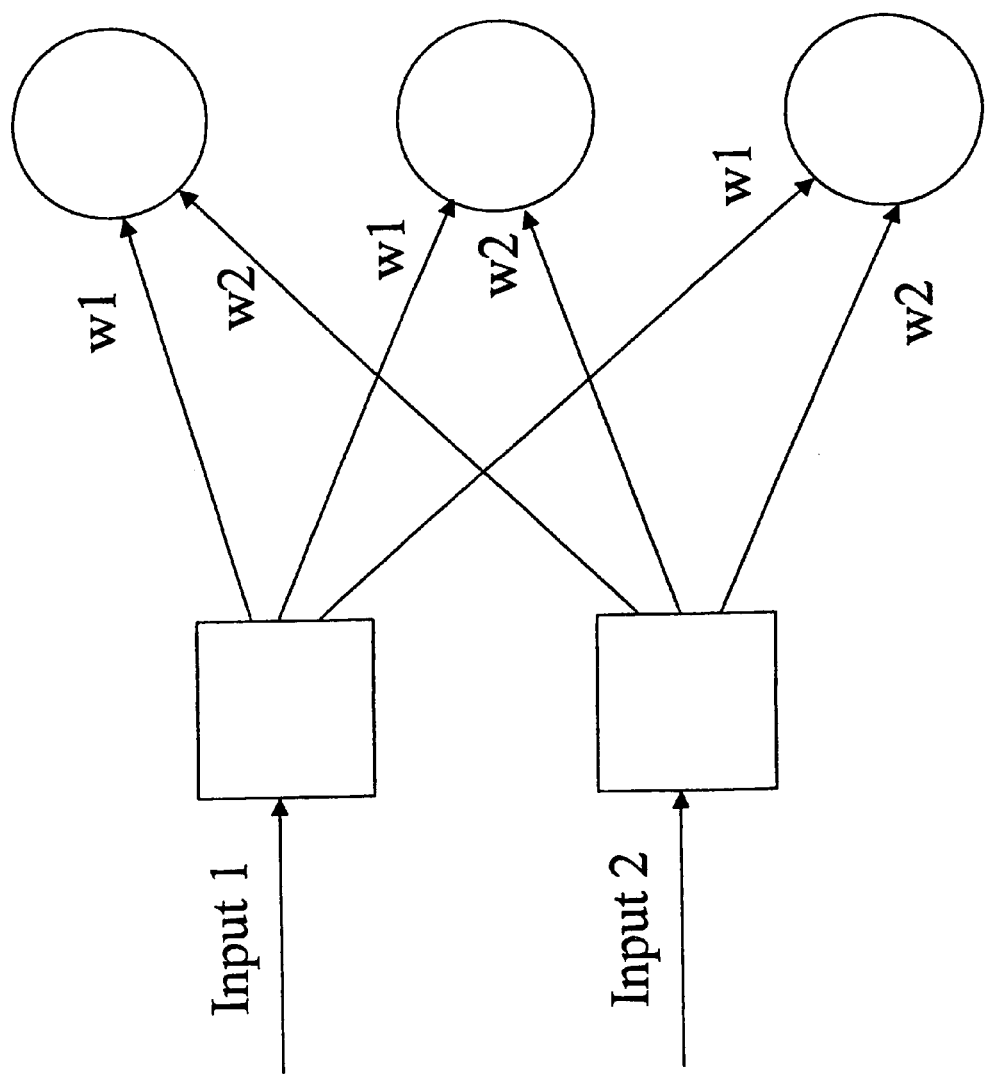
FIG. 8 is a schematic depiction of one embodiment of a two layer neural network according to the instant invention. The squares represent weighting units and the circles represents accumulation units.

One embodiment of a neural network in accordance with the instant invention is presented in FIG. 8 herein. The network of FIG. 8 herein includes two weighting units and three accumulation units. Each weighting unit receives an input signal and provides a weighted signal to each of the three accumulation units. The accumulation units may have different thresholds and each responds to the combined weighted signals that it receives as described hereinabove. In the embodiment of FIG. 8, each of the three accumulation units receives the same combined weighted signal ($w_1+w_2$). Since each of the three accumulation units may have a different threshold, the output signals from the accumulation units may differ. The combined weighted signal may induce firing of none, some, or all of the accumulation units. The output signals are accordingly influenced.

Embodiments of networks analogous to that of FIG. 8 having more than two weighing units or other than three accumulation units (two, four or more, for example) or having activation units succeeding one or more accumulation units are also within the scope of the instant invention. Each weighting unit in a neural network may be connected to all or less than all of the accumulation units present in the network. Each weighting unit may have a different weighting factor or some or all of the weighting units may have the same weighting factor. Each accumulation unit may have a different threshold or some or all of the accumulation units may have the same threshold. A wide range of neural networks that include varying numbers of weighting units, weighting factors, accumulation units, and thresholds as well as different connectivity patterns is in accordance with the instant invention.

The neural network embodiment of FIG. 8 is an example of a two-layer neural network. The set of inputs corresponds to a first layer and the combination of weighting units and accumulation units shown corresponds to a second layer. In addition to including more weighting units, accumulation units and/or activation units within a layer as discussed in the preceding paragraph, networks may be extended by including more layers. A second layer, for example, may be formed by connecting additional weighting units and/or accumulation units in series to a first layer. A third layer may be similarly formed by connecting additional weighting and/or accumulation units to a second layer and so on. In embodiments having two or more layers, the last layer in a succession of layers is the output layer and layers connected between the input and output layers may be referred to as hidden layers.

Figure 9:
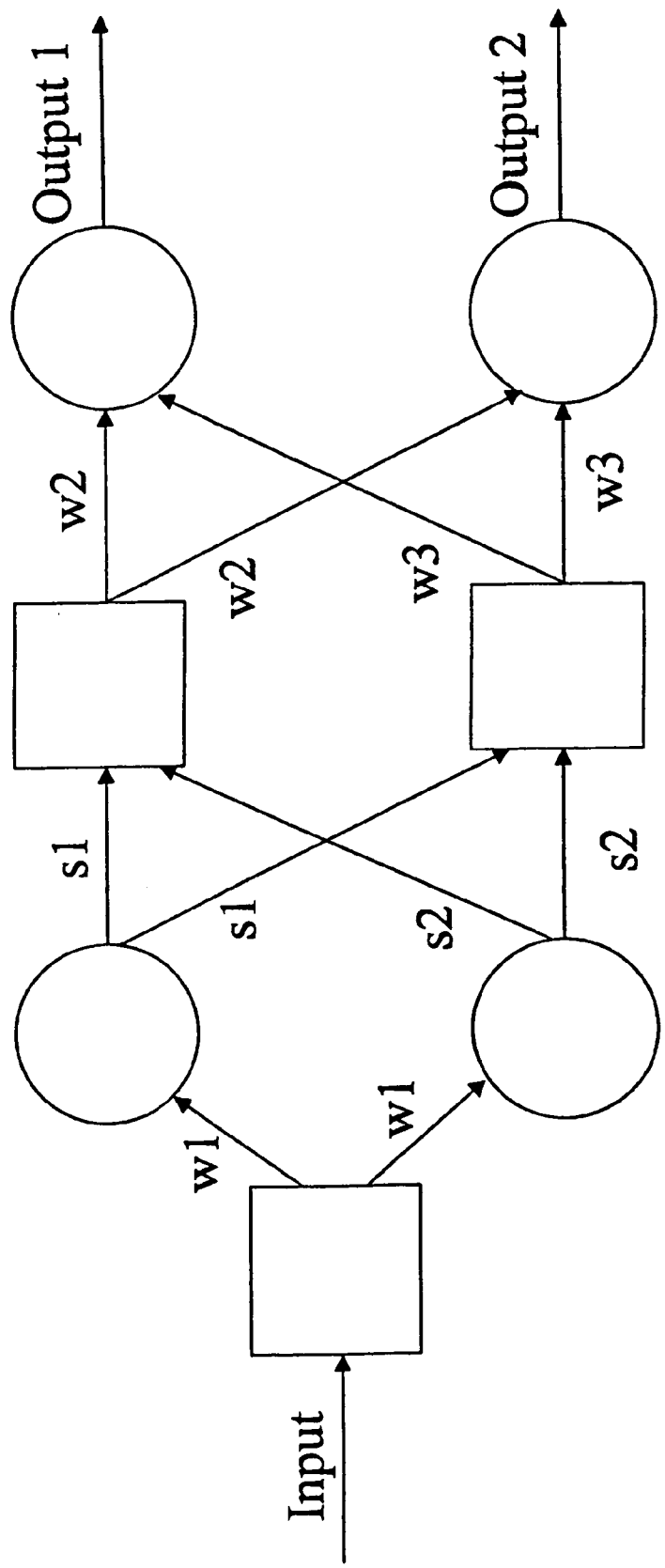
FIG. 9 is a schematic depiction of one embodiment of a multilayer neural network according to the instant invention. The squares represent weighting units and the circles represents accumulation units.

An example of a three layer network is presented in FIG. 9 herein. In this embodiment, a single input is provided to a weighting unit that provides a weighted signal $w_1$ to two accumulation units. The input corresponds to an input layer and the weighting unit that provides the signal $w_1$ and the accumulation units that receive the signal $w_1$ correspond to a hidden layer. The accumulation units of the hidden layer provide intermediate signals $s_1$ and $s_2$ to the weighting units of the succeeding output layer. The weighting units of the output layer receive the intermediate signals $s_1$ and $s_2$ and transform them to weighted signals $w_2$ and $w_3$ that are provided to the accumulation units of the output layer. The accumulation units of the output layer provide the final outputs of the network of FIG. 9. Within the network, the weighting units and accumulation units function as described hereinabove.

Other multilayer networks are readily envisioned within the scope of the instant invention. Networks generally including multiple layers, each of which may include a plurality of weighting, accumulation and/or activation units are included within the scope of the instant invention. Within each layer, each weighting unit may be connected to all or less than all of the accumulation units. Similarly, between layers, intermediate signals provided by accumulation units may be directed toward all or less than all of the weighting units in the succeeding layer of the network. The instant invention further provides for the bypassing of layers. An intermediate signal provided by an accumulation unit of the first layer of a multilayer network may be directly provided, for example, to a weighting unit of the third layer without being modified by a weighting, accumulation or activation unit of the second layer. A wide range of connectivity schemes within and between layers is thus possible with the instant invention.

The instant invention further provides for reconfigurability of function. The ability of the instant neural computing medium to be configured to operate in either weighting mode or accumulation mode implies that a network of the instant weighting, accumulation and/or activation units may be dynamically reconfigured as needed to address new problems or to respond to new circumstances or external stimuli. That the instant neural computing medium is inherently reconfigurable is demonstrated, for example, by the firing that occurs when the accumulation unit reaches its threshold. Upon firing, the accumulation unit is transformed to a low resistance set state and is no longer able to function as an accumulation unit. Instead, the low resistance set state is one of a plurality of weighting states associated with the instant neural computing medium. Firing, thus converts an accumulation unit into a weighting unit. A weighting unit that includes the instant neural computing medium may similarly be converted to an accumulation unit by applying energy sufficient to reset the instant neural computing medium, as described hereinabove. An activation unit that includes the instant neural computing medium may use accumulation states to effect a mathematical operation. Such an activation unit may also be used as an accumulation unit or may be converted to a weighting unit by setting the instant neural computing medium.

Figure 10:
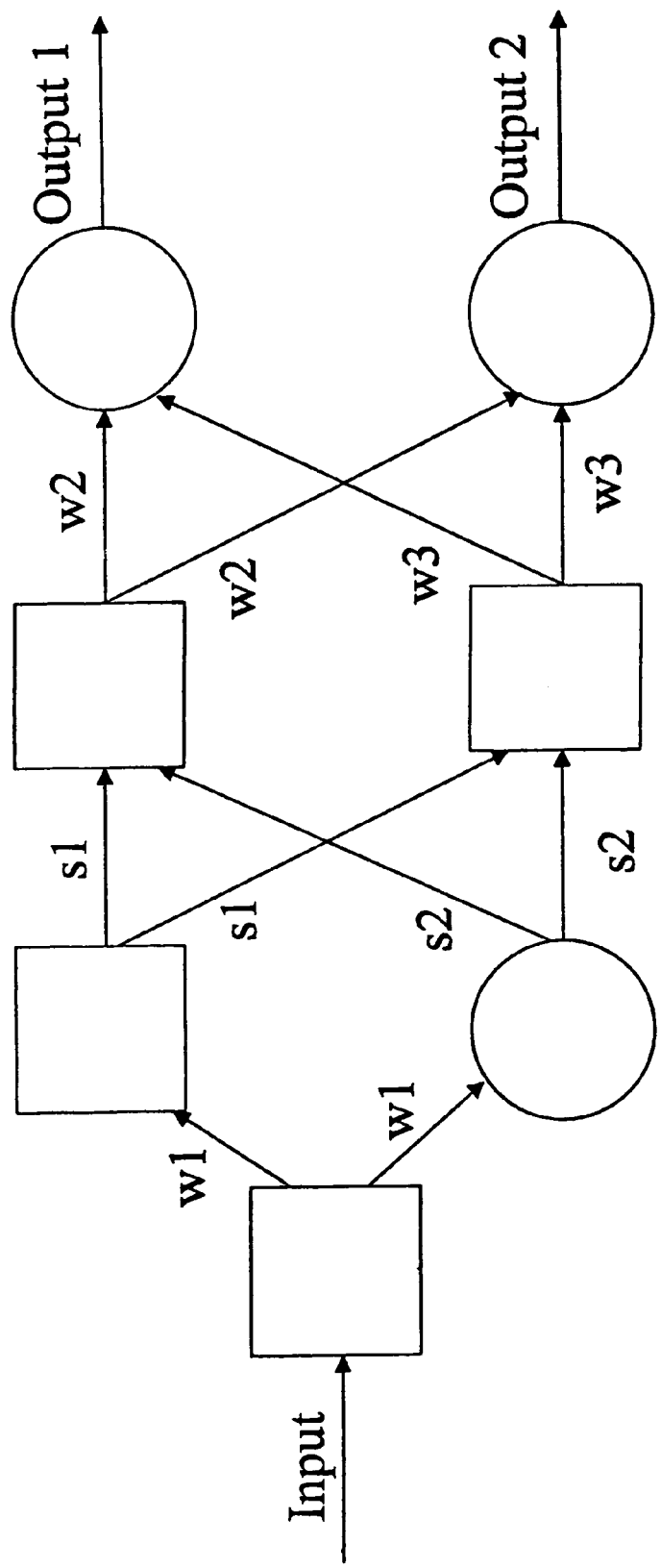
FIG. 10 is a schematic depiction of one embodiment of a multilayer neural network according to the instant invention. The depiction shown may be obtained through a reconfiguration of the network shown in FIG. 9. The squares represent weighting units and the circles represents accumulation units.

The intrinsic reconfigurability of the instant neural computing medium provides a dynamic capability to neural networks that include the instant weighting, accumulation and/or activation units. For one task, for example, a particular combination and connectivity of weighting, accumulation, and/or activation units may be required. For another task, a different combination and/or connectivity may be required. By appropriately setting and/or resetting the instant neural computing medium, it is possible to interconvert among weighting, accumulation and activation functionality at the unit or node level of a neural network. The number of each type of unit may be adjusted according to need. The neural network depicted in FIG. 9 herein, for example, may be reconfigured to provide the network presented in FIG. 10 herein. In this reconfiguration, one of the accumulation units of the network of FIG. 9 has been converted to a weighting unit. The upper branch of the reconfigured network includes a succession of three weighting units and includes less neurosynaptic firing capability than the original network. Clearly, the networks of FIGS. 9 and 10 herein respond to input signals in different ways and provide different composite functionalities. It is straightforward to dynamically convert between the network configurations of FIGS. 9 and 10. Reconfigurability may similarly be achieved in all embodiments of the instant inventions. The instant invention thus provides a dynamic, rather than static, neural network functionality.

The reconfigurability aspects of the instant invention further extend to the weighting factors of the weighting units. As described hereinabove, the weighting factor is determined by the resistance of the weighting unit. Thus, by controlling the resistance, it is possible to alter weighting factors and thereby alter the properties of the instant weighting units. Variation of the resistance of conventional resistance means may be accomplished through, for example, variable resistors or by directing signals through different resistors. When weighting is accomplished by the weighting mode of the instant neural computing medium, the weighting factor may be varied by transforming the instant neural computing medium from one weighting state to another. As described hereinabove, transformations of the instant neural computing medium among its weighting states may be achieved by applying appropriate amounts of energy at appropriate rates to achieve appropriate powers.

Variations in weighting factors may be used to influence the relative importance of different branches or units within a neural network and hence provide further flexibility in tailoring the performance of a neural network. The weighting factors in neural networks are frequently viewed as being integral to memory and learning. A particular distribution of weighting factors across a neural network defines the connection strength between weighting units and accumulation units thereby controlling the relative importance of different units, pathways or branches through a neural network. The response of a neural network to a particular input stimulus or stimuli, for example, is significantly influenced by the weighting factors that control connection strength. Typically, it is desired to associate a particular output or collection of outputs of a neural network with a particular input or collection of inputs. This association may be achieved by appropriately setting the weighting factors of the network. Reconfiguration of weighting factors may change the association relationship thereby providing for new responses to old stimuli. The establishment and control of weighting factors thus provide for an adaptive or dynamic learning capability akin to that encountered in biological neural networks. Further functional flexibility may be achieved through variations in the threshold of accumulation units.

One way to interconvert among the weighting, accumulation and activation functionality for the units of the instant invention, is to include means for setting and resetting the instant neural computing medium. Setting and resetting means may be included separately at each unit, centrally to an entire network or portions thereof with appropriate addressing of individual units, or a combination thereof. Setting and resetting require the addition of appropriate amounts of energy and/or power to the instant neural computing medium. Energy may be added in many forms including electrical, optical, electromagnetic, and thermal energy. Interconversions among weighting states require the addition of appropriate amounts of energy at appropriate rates to achieve appropriate powers as described hereinabove. Means for setting and resetting and for providing energy and/or power to a phase change material have been previously described in U.S. Pat. Nos. 5,159,661; 5,912,839 and 6,141,241 as well as in U.S. patent application Ser. Nos. 10/144,319 and 10/155,527.

Interconversions among unit functionalities or weighting states may also occur in response to input signals, external stimuli, or signals from sensory units. A signal sufficient to set, for example, may convert an accumulation unit into a weighting unit. A signal with sufficiently high power, for example, may transform a weighting unit from one weighting state to another. Thus, interactions of the instant neurons, units thereof and neural networks with their surroundings or external environment may dictate functionality, response, and/or performance. A bright flash of light or substantial heat, for example, may signify an emergency condition that provides an input signal to a weighting unit with sufficient power to influence its weighting factor and alter the response of a network accordingly.

The disclosure set forth herein is illustrative and not intended to limit the practice of the instant invention. Numerous equivalents and trivial variations thereof are envisioned to be within the scope of the instant invention. It is the following claims, including all equivalents, in combination with the foregoing disclosure, which define the scope of the instant invention.

What we claim is:

1. An analog neuron comprising:
    a weighting unit, said weighting unit having a weighting factor, said weighting factor being substantially determined by the resistance of said weighting unit; and
    an accumulation unit, said accumulation unit comprising a first phase change material, said first phase change material comprising one or more elements selected from the group consisting of In, Ag, Te, Se, Ge, Sb, Bi, Pb, Sn, As, S, P, and mixtures or alloys thereof, said first phase change material having a plurality of states, said states including: a reset state; a set state obtainable from said reset state by applying energy in an amount corresponding to the set energy of said reset state, said set energy corresponding to the threshold of said neuron, said set state having lower resistance than said reset state, said set state being transformable to said reset state by applying energy in an amount corresponding to the reset energy of said set state; and one or more accumulation states having substantially the same resistance as said reset state, said accumulation states being obtainable from said reset state by applying energy in an amount less than said threshold;
    wherein said accumulation unit is connected in series with said weighting unit, said first phase change material is in said reset state or one of said accumulation states, and said weighting factor determines the extent of electrical communication between said weighting unit and said accumulation unit.

2. The analog neuron of claim 1, wherein said weighting unit comprises a second phase change material, said second phase change material having a plurality of states, said states including: a reset state; a set state obtainable from said reset state by applying energy in an amount corresponding to the set energy of said reset state, said set state having lower resistance than said reset state, said set state being transformable to said reset state by applying energy in an amount corresponding to the reset energy of said set state; and one or more weighting states having a resistance greater than the resistance of said set state and less than the resistance of said reset state, said weighting states being obtainable from said set state by applying energy in an amount less than said reset energy of said set state, said resistance of said set state or said one or more weighting states substantially determining said weighting factor; said second phase change material being in said set state or one of said weighting states.

3. The analog neuron of claim 2, wherein said first and second phase change materials have the same composition.

4. The analog neuron of claim 2, wherein said second phase change material is in physical contact with said first phase change material.

5. The analog neuron of claim 2, further including means for adjusting said weighting factor of said second phase change material, said means for adjusting including providing energy to said phase change material, said provided energy being applied at a rate sufficient to induce a transformation of said second phase change material from one of said weighting states to another of said weighting states.

6. The analog neuron of claim 1, further comprising an activation unit, said activation unit being connected in series with said accumulation unit, said activation unit including means for performing mathematical operations.

7. The analog neuron of claim 6, wherein said activation unit comprises a third phase change material.

8. The analog neuron of claim 7, wherein said third phase change material has the same composition as said first phase change material.

9. The analog neuron of claim 1, wherein said first phase change material comprises Te and Se.

10. The analog neuron of claim 1, wherein said first phase change material further comprises a transition metal element.

11. The analog neuron of claim 10, wherein said transition metal is selected from the group consisting of Cr, Fe, Ni, Nb, Pd, and Pt.

12. The analog neuron of claim 1, wherein said weighting unit includes a variable resistor, said variable resistor substantially providing said resistance of said weighting unit.

13. The analog neuron of claim 1, further including means for resetting said accumulation unit, said resetting means including means for providing energy to said first phase change material.

14. A neural network comprising:
data input means and
the analog neuron of claim 1, wherein said data input means provides an input signal to said weighting unit, said weighting unit weighting said input signal according to said weighting factor to produce a weighted signal, said weighted signal being provided to said accumulation unit.

15. The neural network of claim 14, wherein said data input means further provides an input signal to said accumulation unit.

16. The neural network of claim 14, wherein said input signal includes energy in a form selected from the group consisting of electrical, optical, electromagnetic, and thermal.

17. The neural network of claim 16, wherein said electrical form of energy includes an electric current pulse.

18. The neural network of claim 16, wherein said electromagnetic form of energy has a visible, infrared, microwave or radio frequency.

19. The neural network of claim 14, wherein said data input means include an external stimulus, said external stimulus originating from an effect or action in the external surroundings of said neural network, said external stimulus producing said input signal.

20. The neural network of claim 19, wherein said external stimulus is selected from the group consisting of heat, light, sound, motion, moisture, chemical species and electric potential.

21. The neural network of claim 19, further comprising a sensory unit, said sensory unit producing said input signal in response to said external stimulus.

22. The neural network of claim 21, wherein said sensory unit is selected from the group consisting of a photocell, a microphone, a heat sensor, a camera, an antenna, a moisture sensor and a chemical sensor.

23. The neural network of claim 14, wherein said weighted signal is sufficient to fire said accumulation unit.

24. The neural network of claim 14, wherein said data input means provides synchronous input signals.

25. A neural network comprising:
one or more weighting units, each of said weighting units having a weighting factor, said weighting factor being substantially determined by the resistance of said weighting unit; and
one or more accumulation units, each of said accumulation units comprising a phase change material, said phase change material having a plurality of states, said states including: a reset state; a set state obtainable from said reset state by applying energy in an amount corresponding to the set energy of said reset state, said set energy corresponding to the threshold of said accumulation unit, said set state having lower resistance than said reset state, said set state being transformable to said reset state by applying energy in an amount corresponding to the reset energy of said set state; and one or more accumulation states having substantially the same resistance as said reset state, said accumulation states being obtainable from said reset state by applying energy in an amount less than said threshold;
wherein each of said weighting units is connected in series with at least one of said accumulation units and at least one of said weighting units is connected to two or more of said accumulation units, each of said accumulation units is connected in series with at least one of said weighting units, said phase change material of each of said accumulation units is in said reset state or one of said accumulation states, and said weighting factors determine the extent of electrical communication between the interconnected of said weighting units and said accumulation units.

26. The neural network of claim 25, wherein each of said weighting units comprises a phase change material, said phase change material having a plurality of states, said states including: a reset state; a set state obtainable from said reset state by applying energy in an amount corresponding to the set energy of said reset state, said set state having lower resistance than said reset state, said set state being transformable to said reset state by applying energy in an amount corresponding to the reset energy of said set state; and one or more weighting states having a resistance greater than the resistance of said set state and less than the resistance of said reset state, said weighting states being obtainable from said set state by applying energy in an amount less than said reset energy of said set state, said resistance of said set state or said one or more weighting states substantially determining said weighting factor; said phase change material being in said set state or one of said weighting states.

27. The neural network of claim 26, further including means for adjusting at least one of said weighting factors, said means for adjusting including providing energy to said phase change material of at least one of said weighting units, said provided energy being applied at a rate sufficient to induce a transformation of said phase change material of said at least one of said weighting units from one of said weighting states to another of said weighting states.

28. The neural network of claim 26, further including means for applying energy to at least one of said weighting units, wherein said means for providing energy provides sufficient energy to reset said at least one of said weighting units, thereby converting said at least one of said weighting units to an accumulation unit.

29. The neural network of claim 25, wherein at least one of said accumulation units is connected to two or more of said weighting units.

30. The neural network of claim 25, wherein said network is a multilayer network.

31. The neural network of claim 25, further comprising one or more activation units, each of said activation units being connected in series with at least one of said accumulation units, said activation units including means for performing mathematical operations.

32. The neural network of claim 31, wherein each of said activation units comprises a phase change material.

33. The neural network of claim 25, further including means for applying energy to at least one of said accumulation units, wherein said means for providing energy provides sufficient energy to set said at least one of said accumulation units, thereby converting said at least one of said accumulation units to a weighting unit.

* * * * *